United States Patent
Nonoyama et al.

(10) Patent No.: US 7,501,710 B2
(45) Date of Patent: Mar. 10, 2009

(54) SEMICONDUCTOR INTEGRATED CIRCUIT AND METHOD OF MANUFACTURING THE SAME

(75) Inventors: Shigeru Nonoyama, Takatsuki (JP); Naoto Ueda, Kawanishi (JP)

(73) Assignee: Panasonic Corporation, Osaka (JP)

( * ) Notice: Subject to any disclaimer, the term of this patent is extended or adjusted under 35 U.S.C. 154(b) by 304 days.

(21) Appl. No.: 11/333,297

(22) Filed: Jan. 18, 2006

(65) Prior Publication Data

US 2006/0157740 A1 Jul. 20, 2006

(30) Foreign Application Priority Data

| Jan. 18, 2005 | (JP) | ............................. 2005-009719 |
| Oct. 31, 2005 | (JP) | ............................. 2005-315525 |

(51) Int. Cl.
- *H01L 23/48* (2006.01)
- *H01L 23/52* (2006.01)
- *H01L 29/40* (2006.01)

(52) U.S. Cl. ...................... 257/786; 257/200; 257/207; 257/211; 257/758

(58) Field of Classification Search ......... 257/203–211, 257/691–758, 200, 786
See application file for complete search history.

(56) References Cited

U.S. PATENT DOCUMENTS

| 6,242,814 | B1 * | 6/2001 | Bassett ...................... 257/786 |
| 6,534,879 | B2 * | 3/2003 | Terui ......................... 257/786 |
| 6,836,026 | B1 * | 12/2004 | Ali et al. .................... 257/786 |
| 6,870,273 | B2 * | 3/2005 | Tao et al. .................... 257/778 |
| 6,885,046 | B2 * | 4/2005 | Suzuki et al. ............... 257/207 |
| 7,203,916 | B2 * | 4/2007 | Dotson et al. .................. 716/5 |
| 2002/0140002 | A1 * | 10/2002 | Suzuki et al. ............... 257/207 |
| 2003/0137861 | A1 | 7/2003 | Thies et al. .................. 365/63 |
| 2004/0026794 | A1 * | 2/2004 | Tao et al. .................... 257/778 |

FOREIGN PATENT DOCUMENTS

JP 6-244235 9/1994

* cited by examiner

*Primary Examiner*—Zandra Smith
*Assistant Examiner*—Telly D Green
(74) *Attorney, Agent, or Firm*—Steptoe & Johnson LLP (57) ABSTRACT

A semiconductor integrated circuit (1) having an integrated circuit region (1*a*), and a plurality of I/O cells (6) each having an element formation region for external electrical connection from the element formation region. An input/output signal electrode pad (3), a power supply electrode pad (4) and a GND electrode pad (5) are placed on an element formation region of each I/O cell (6).

6 Claims, 7 Drawing Sheets

SEMICONDUCTOR INTEGRATED CIRCUIT AND METHOD OF MANUFACTURING THE SAME

FIELD OF THE INVENTION

The present invention relates to a semiconductor integrated circuit and a method of manufacturing the semiconductor integrated circuit and, more particularly, to an input/output (I/O) cell formed on the periphery of an integrated circuit region so as to extend outward.

BACKGROUND OF THE INVENTION

A conventional semiconductor integrated circuit will be described with reference to drawings.

Figure 9A:
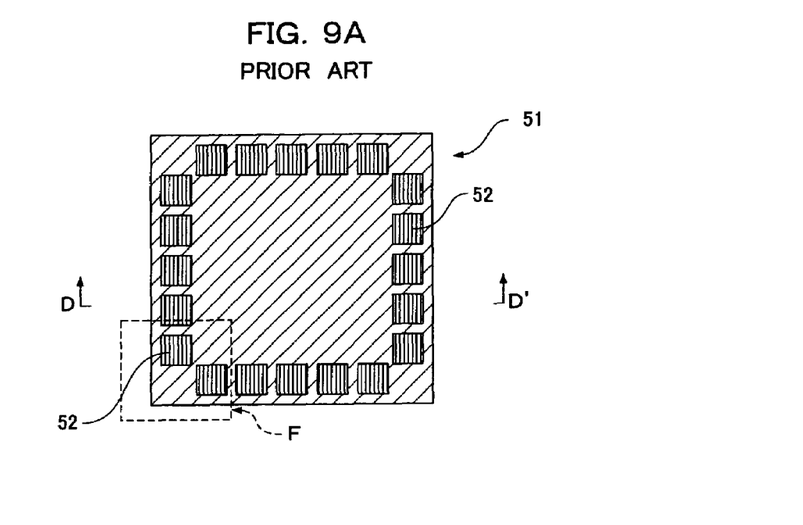
FIG. 9A is a plan view schematically showing the construction of a conventional semiconductor integrated circuit.
Figure 9B:
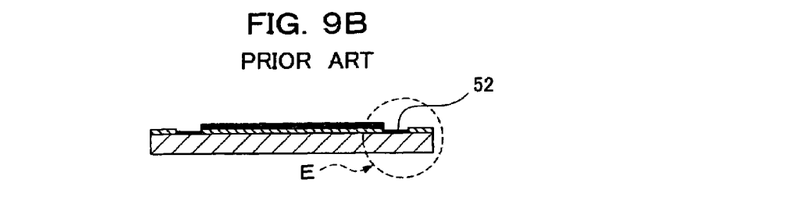
FIG. 9B is a sectional view taken along line D-D' in FIG. 9A.
Figure 9C:
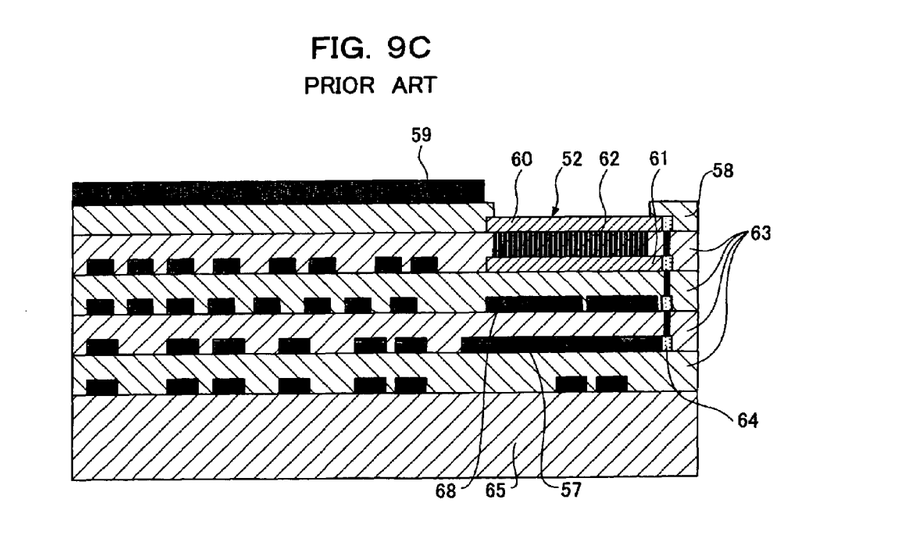
FIG. 9C is an enlarged diagram of portion E in FIG. 9B.

FIG. 9A is a plan view of an ordinary construction of a semiconductor integrated circuit. FIG. 9B is a sectional view taken along line D-D' in FIG. 9A. FIG. 9C is an enlarged view of portion E in FIG. 9B.

This conventional semiconductor integrated circuit has a five-layer wiring structure.

In the following description, a structure in which each of input/output signal electrode pads corresponding to those provided outside an element formation region for an input/output circuit in other structures is provided on an element formation region for an input/output circuit is referred to as a pad on element (POE) structure.

An ordinary construction in an electrode portion of the semiconductor integrated circuit having a five-layer wiring structure and a POE structure will be described briefly with reference to FIGS. 9A to 9C.

In FIGS. 9A to 9C, reference numeral 51 denotes the semiconductor integrated circuit (also called a semiconductor chip), reference numeral 52 an electrode pad having a POE structure; reference numeral 58 a first protective film of PSiN or the like; reference numeral 59 a second protective film of polyimide or the like; reference numeral 63 an interlayer insulating film; and reference numeral 65 a silicon substrate.

The electrode pad 52 having a POE structure has a stacked via structure formed by an uppermost-layer pad metal 60, a lower-layer pad metal 61 formed in a wiring layer immediately below the uppermost-layer pad metal 60, and a via 62 for connection between the two pad metals 60 and 61. This stacked via structure is effective in limiting cratering caused in a bonding step such as a wire bonding step.

A first power-supply-layer metal 68 for supplying power is formed below the electrode pad 52. A lowermost-layer metal 57 for supply of a signal to an input/output signal circuit is formed as a layer under the first power-supply-layer metal 68. The electrode pad 52 and the lowermost-layer metal 57 are electrically connected to each other by a stack structure of a lead metal 64.

Figure 10:
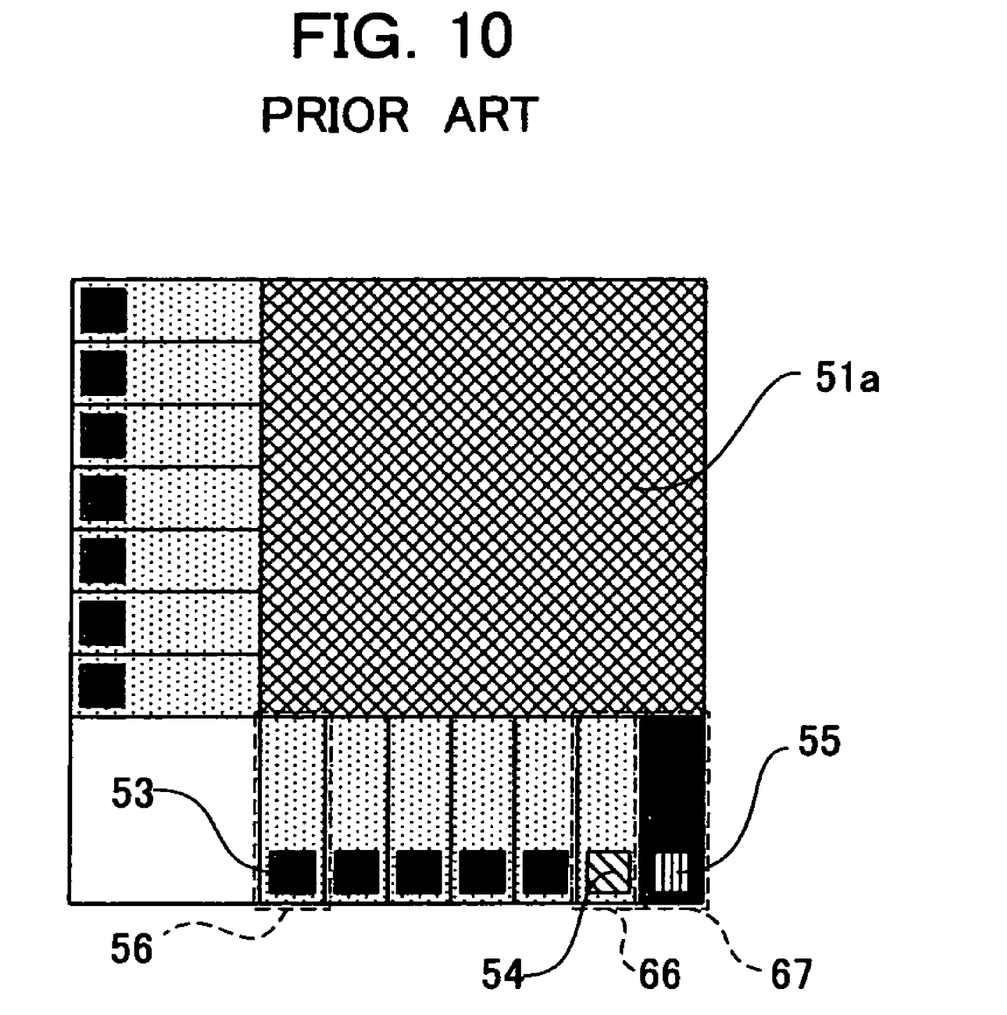
FIG. 10 is an enlarged plan view of an I/O cell portion corresponding to portion F in FIG. 9A.

A description based on the above description of the ordinary construction will be made of a semiconductor integrated circuit having a conventional electrode pad structure with reference to FIG. 10. FIG. 10 is an enlarged plan view corresponding to a portion F shown in FIG. 9A.

In the conventional semiconductor circuit having a POE structure, as shown in FIG. 10, a power supply electrode pad 54 is formed on a power supply cell 66, a GND electrode pad 55 is formed on a GND cell 67, and an input/output signal electrode pad 53 is formed on an element formation region of each of I/O cells 56 (an input/output circuit region).

Such a structure in which electrode pads are placed on element formation regions of cells for the purpose of reducing the chip size has already been proposed.

For example, a semiconductor integrated circuit has been proposed in which an interlayer insulating film is provided on a logic circuit or a driver circuit, and an electrode pad for an input signal or an output signal is formed on the interlayer insulating film (see, for example, Japanese Patent Laid-Open No. 6-244235).

In the above-described conventional semiconductor integrated circuit, however, the dependence of the chip size on the area of electrode pads tends to increase since the size of the active element region for the essential function of a semiconductor element is reduced with the adaptation of the diffusion process to finer design rules.

With the development of semiconductor integrated circuits operated at lower voltages, there is a tendency to increase the numbers of power supply pads and GND pads relative to the number of I/O cells for input and output signals for stabilization of signals for example. Because of the increase in the numbers of power supply pads and GND pads, the tendency of the dependence of the chip size on the area of electrode pads is further increased.

Conventionally, a reduction in electrode pad area in such semiconductor integrated circuits and, hence, a reduction in size of the semiconductor integrated circuits have been achieved by the method of reducing the size of electrode pads by reducing the pitch between the electrode pads.

There is a problem that, with the reduction in size of electrode pads by reducing the width of pads, assembly operations including operations to form wires and bumps on electrode pads and an operation to perform molding for resin encapsulation have become considerably difficult to perform.

DISCLOSURE OF THE INVENTION

In view of the above-described problem, an object of the present invention is to provide a semiconductor integrated circuit which, even in a situation where the dependence of the chip size on the electrode pad area is increased with the adaptation of the diffusion process to a finer design rule and the design to operate the semiconductor integrated circuit at a lower voltage, can be reduced in size without reducing the width of electrode pads and can be designed so as to achieve an improvement in the facility with which assembly operations are performed and an improvement in productivity, and a method of manufacturing the semiconductor integrated circuit.

To achieve the above-described object, according to a first aspect of the present invention, there is provided a semiconductor integrated circuit including an integrated circuit region, and a plurality of I/O cells each having an element formation region for external electrical connection from the element formation region, wherein at least one input/output signal electrode pad and a power supply electrode pad or a GND electrode pad are provided on the element formation region of each I/O cell.

According to a second aspect of the present invention, there is provided a semiconductor integrated circuit including an integrated circuit region, and a plurality of I/O cells each having an element formation region for external electrical connection from the element formation region, wherein an input/output signal electrode pad, a power supply electrode pad and a GND electrode pad are provided on the element formation region of each I/O cell.

According to a third aspect of the present invention, there is provided a semiconductor integrated circuit including an integrated circuit region, and a plurality of I/O cells each having an element formation region for external electrical connection from the element formation region, wherein an I/O cell having a power supply electrode pad and at least one input/output signal electrode pad provided on the element formation region, and an I/O cell having a GND electrode pad and at least one input/output signal electrode pad provided on the element formation region, are mixedly located.

According to a fourth aspect of the present invention, there is provided a semiconductor integrated circuit including an integrated circuit region, and a plurality of I/O cells each having an element formation region formed outward from a peripheral portion of the integrated circuit region for external electrical connection from the element formation region, wherein an adjacent pair of first I/O cells each having two input/output signal electrode pads and one power supply electrode pad provided in this order on the element formation region from the inner position that is on a periphery side toward an outer position, and an adjacent pair of second I/O cells each having two input/output signal electrode pads and one GND electrode pad provided in this order on the element formation region from the inner position toward the outer position, are mixedly located, the input/output signal electrode pads and the power supply electrode pads in the adjacent pair of the first I/O cells are formed as one input/output signal electrode pad and one power supply electrode pad, respectively, to straddle the pair of I/O cells, and the input/output signal electrode pads and the GND electrode pads in the adjacent pair of the second I/O cells are formed as one input/output signal electrode pad and one GND electrode pad, respectively, to straddle the pair of I/O cells.

In the fourth aspect of the present invention, a portion of the input/output signal electrode pad at the inner position on each pair of I/O cells formed so as to straddle the pair of I/O cells may be extended to the input/output signal electrode pad at an intermediate position provided outside the input/output signal electrode pad at the inner position, and a portion of the input/output signal electrode pad at the intermediate position may be extended to the power supply electrode pad at an outer position.

Also, in the fourth aspect of the present invention, a portion of the input/output signal electrode pad at the inner position on each pair of I/O cells formed so as to straddle the pair of I/O cells may be extended to the power supply electrode pad at an outer position via a position by the side of the input/output signal electrode pad at an intermediate position, and a portion of the input/output signal electrode pad at the intermediate position may be extended to the power supply electrode pad at the outer position.

According to a fifth aspect of the present invention, there is provided a semiconductor integrated circuit including an integrated circuit region, and a plurality of I/O cells each having an element formation region formed outward from a peripheral portion of the integrated circuit region for external electrical connection from the element formation region, wherein a first cell group including four I/O cells adjacent one to another and each having two input/output signal electrode pads and one power supply electrode pad provided in this order on the element formation region from an inner position that is on a periphery side toward an outer position, and a second cell group including four I/O cells adjacent one to another and each having two input/output signal electrode pads and one GND electrode pad provided in this order on the element formation region from the inner position toward the outer position, are mixedly located, each pair of input/output signal electrode pads in each of two adjacent pairs of I/O cells in the first cell group are formed as one input/output signal electrode pad to straddle the pair of I/O cells, and the power supply electrode pads in the first cell group are formed as one power supply electrode pad to straddle the four I/O cells in the first cell group, and each pair of input/output signal electrode pads in each of two adjacent pairs of I/O cells in the second cell group are formed as one input/output signal electrode pads to straddle the pair of I/O cells, and the GND electrode pads in the second cell group is formed as one GND electrode pad to straddle the four I/O cells in the second cell group.

According to a sixth aspect of the present invention, there is provided a method of manufacturing a semiconductor integrated circuit, including a step of forming an integrated circuit region and an I/O cell region, a step of forming vias at predetermined positions, a step of forming input/output signal electrode pads on the vias, and a step of forming a protective film on the integrated circuit region, wherein the method further includes a step of forming on the I/O cell region a power supply electrode pad and/or a GND electrode pad in addition to the input/output electrode pads.

According to each semiconductor integrated circuit described above and the method of manufacturing the semiconductor integrated circuit, a cell region only for a power supply and/or GND is removed by placing a power supply and/or GND electrode pad on an element formation region of an input/output signal I/O cell to achieve a reduction in size of the semiconductor integrated circuit without reducing the size of electrode pads and without reducing the pitch between electrode pads, even in a situation where the dependence of the chip size on the electrode pad area is increased with the adaptation of the diffusion process to a finer design rule and the design to operate the semiconductor integrated circuit at a lower voltage.

Also, the number of power supply and/or GND pads can be advantageously increased relative to the number of input/output signal I/O cells by placing a power supply and/or GND electrode pad on the element formation region of each input/output signal I/O cell, thus enabling power or GND to be supplied to the input/output signal I/O cell with stability.

Further, since a power supply and/or GND electrode pad is placed on each input/output signal I/O cell, the numbers of power supply and/or GND connection lines and the positions of connection electrode pads for connection of wires can be freely selected at the time of assembly by wire bonding, thus increasing the degree of freedom of assembly operations and enabling production with stability.

These and other features and advantages of the present invention will become apparent from the following description of a preferred embodiment of the invention with reference to the accompanying drawings.

DESCRIPTION OF THE EMBODIMENT

A semiconductor integrated circuit and a method of manufacturing the semiconductor circuit according to a preferred embodiment of the present invention will be described with reference to the accompanying drawings.

Figure 1A:
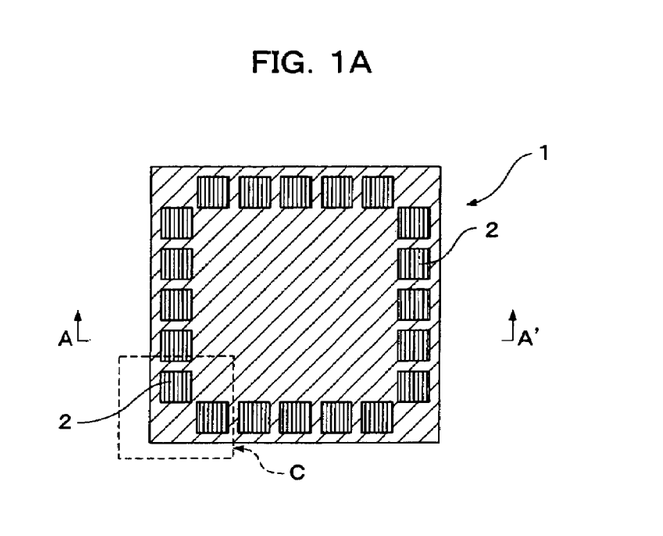
FIG. 1A is a plan view schematically showing the construction of a semiconductor integrated circuit according to an embodiment of the present invention.
Figure 1B:
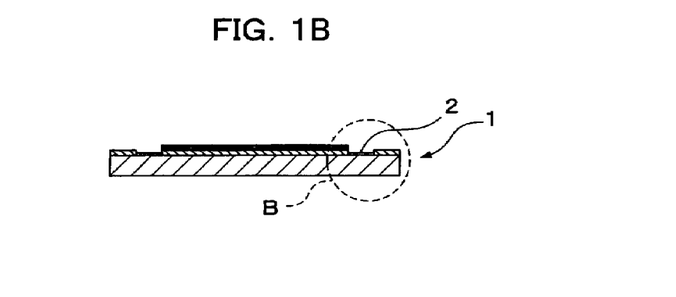
FIG. 1B is a sectional view taken along line A-A' of FIG. 1A.
Figure 1C:
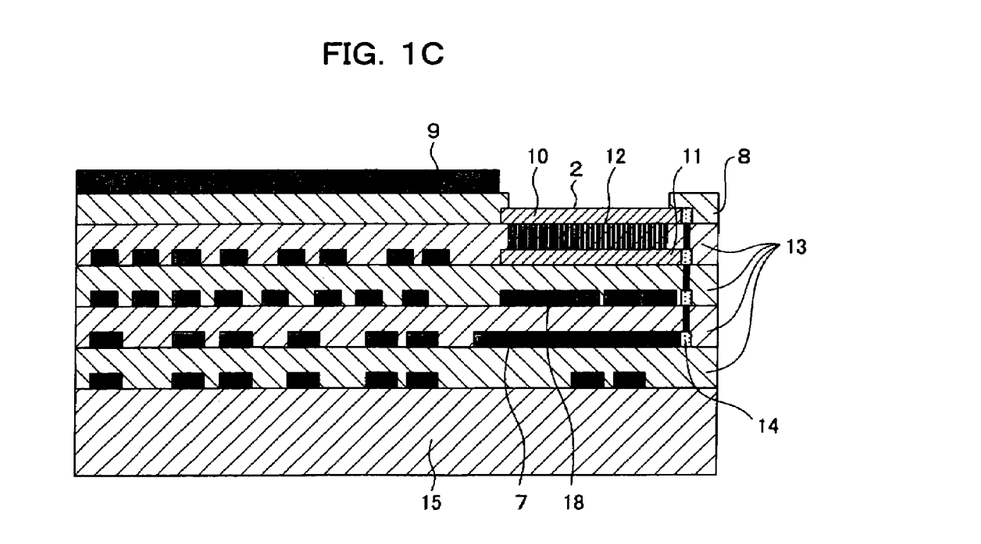
FIG. 1C is an enlarged view of portion B in FIG. 1B.

FIGS. 1A to 1C show a semiconductor integrated circuit of a five-layer wiring structure. In the following description, a structure in which each of input/output signal electrode pads corresponding to those provided outside an element formation region for an input/output circuit in other structures is provided on an element formation region for an input/output circuit is referred to as a pad on element (POE) structure.

An ordinary construction in an electrode portion of the semiconductor integrated circuit having the five-layer wiring structure and the POE structure will be described briefly.

In FIGS. 1A to 1C, reference numeral 1 denotes the semiconductor integrated circuit (also called a semiconductor chip), reference numeral 2 an electrode pad having a POE structure; reference numeral 8 a first protective film of PSiN or the like; reference numeral 9 a second protective film of polyimide or the like; reference numeral 13 an interlayer insulating film; and reference numeral 15 a silicon substrate.

The electrode pad 2 having a POE structure has a stacked via structure formed by an uppermost-layer pad metal 10, a lower-layer pad metal 11 formed in a wiring layer immediately below the uppermost-layer pad metal 10, and a via 12 for connection between the two pad metals 10 and 11. This stacked via structure is effective in limiting cratering caused in a bonding step such as a wire bonding step.

A first power-supply-layer metal 18 for supplying power is formed below the electrode pad 2. A lowermost-layer metal 17 for supply of a signal to an input/output signal circuit is formed as a layer under the first power-supply-layer metal 18. The electrode pad 2 and the lowermost-layer metal 7 are electrically connected to each other by a stack structure of a lead metal 14.

Figure 2:
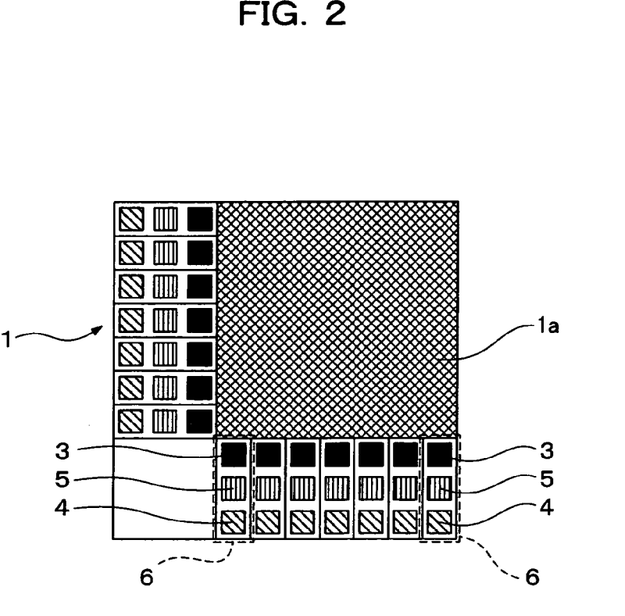
FIG. 2 is an enlarged plan view of an I/O cell portion corresponding to portion C in FIG. 1A.

A description based on the above description of the ordinary construction will be made of a semiconductor integrated circuit having the electrode pad structure in accordance with the present invention with reference to FIG. 2. FIG. 2 is an enlarged plan view corresponding to portion C in FIG. 1A.

An essential feature of the present invention resides in that electrode pads 4 and 5 for power supply and GND, as well as an electrode pad 3 for an input or output signal, are placed on each of I/O cells 6 for input and output signals. These electrode pads 3, 4, and 5 have the same structure as the above-described structure of the electrode pad 2.

That is, the semiconductor integrated circuit 1 includes an integrated circuit region 1a, a plurality of I/O cells 6 placed around the integrated circuit region 1a, input/output signal electrode pads 3 and power supply and GND electrode pads 4 and 5 placed on element formation regions of the I/O cells 6 (corresponding to the second aspect of the present invention).

Each I/O cell 6 is in the form of a rectangle (strip) extending outward as viewed in plan. Properly speaking, each I/O cell 6 is formed so as to project outward from a side (a peripheral portion) of the square integrated circuit region 1a with a predetermined length and a predetermined width. The I/O cell portion shown in FIG. 2 corresponds to portion C in FIG. 1A.

Thus, electrode pads 4 and 5 for power supply and GND are placed (annexed) together with the electrode pad 3 for an input or output signal on the element formation region of each of I/O cells 6 for input and output signals without providing I/O cells for power supply and GND in the semiconductor integrated circuit 1. In this way, the number of cells necessary for the semiconductor device is reduced. Therefore a reduction in size of the semiconductor integrated circuit 1 can be achieved.

Since power and GND can be supplied through each input/output signal I/O cell 6, increased numbers of power and GND supply sources are provided in comparison with a case where cells are provided specially for power supply or GND, thus enabling supply of power and GND with stability.

Further, since the range of selection from power and GND supply sources is increased in wiring bonding in the assembly process, the numbers of power supply and GND connection lines and the positions of connection electrode pads can be freely selected, thus increasing the degree of freedom of assembly operations and enabling production with stability.

Figure 3:
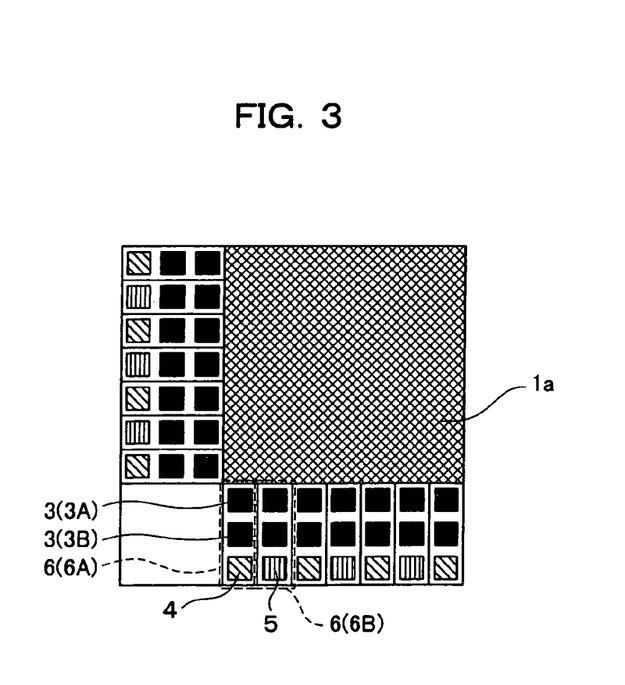
FIG. 3 is an enlarged plan view of an I/O cell portion according to an example of modification of the semiconductor integrated circuit.

While in the above-described embodiment one electrode pad is placed (annexed) as each of the electrode pads 3, 4, and 5 for an input/output signal, power supply and GND on one I/O cell 6, two or more, for example, two input/output signal electrode pads 3 and one electrode pad 4 or 5 for power supply or GND may be placed on one I/O cell 6, as shown in FIG. 3. Even in such a case, the same effect as that in the above-described embodiment can be obtained. The number of input/output signal electrode pads 3 to be placed can be freely selected.

The construction shown in FIG. 3 will be clearly described. On one I/O cell 6 (6A), two input/output signal electrode pads 3 (3A and 3B) and one power supply electrode pad 4 are placed in this order from the inner side toward the outer side. In another I/O cell 6 (6B) adjacent to the one I/O cell 6 (6A), two input/output signal electrode pads 3 (3A and 3B) and one GND electrode pad 5 are placed in this order from the inner side toward the outer side (corresponding to the third aspect of the present invention). That is, two input/output signal electrode pads 3 are placed at inner positions on each I/O cell 6 and power supply electrode pads 4 and GND electrode pads 5 are alternately (mixedly) placed at the outermost positions. In the case where two input/output signal electrode pads 3 are placed on one I/O cell 6, one of the input/output signal electrode pads 3 is used for wire bonding while the other input/output signal electrode pad is used for probing. If the electrode pads are selectively used in this way, the facility with which connection operations are performed in wire bonding can be improved.

Figure 4:
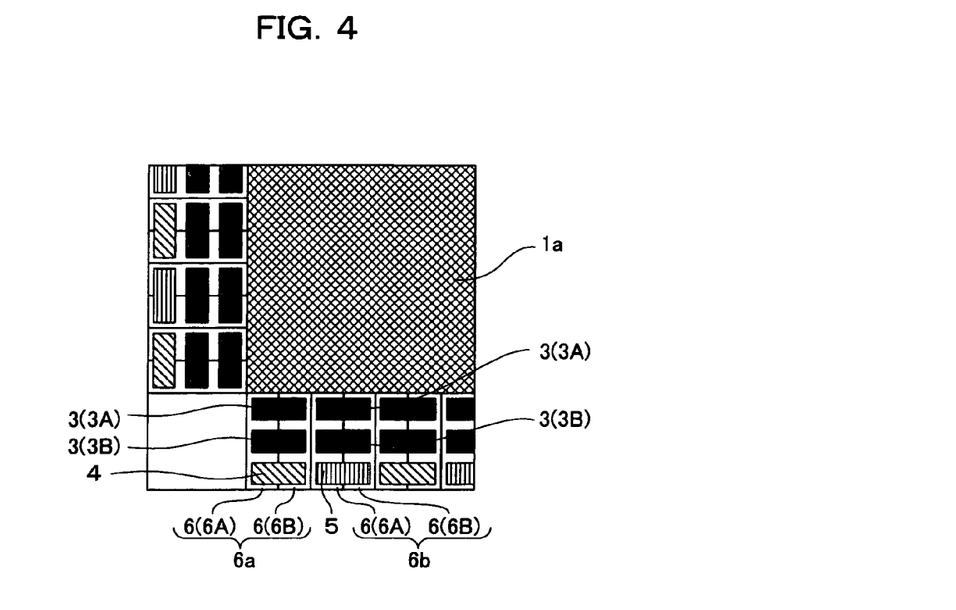
FIG. 4 is an enlarged plan view of an I/O cell portion according to another example of modification of the semiconductor integrated circuit.

An arrangement such as shown in FIG. 4 may also be adopted in which at least one, for example, two input/output signal electrode pads 3 (3A and 3B) and one power supply electrode pad 4 or one GND electrode pad 5 are placed (annexed) so as to straddle an adjacent pair of I/O cells 6 (6A and 6B). In this case, one input/output signal electrode pad 3A is electrically connected to one I/O cell 6A, while the other input/output signal electrode pads 3B is electrically connected to the other I/O cell 6B.

In this arrangement, since each of electrode pads 3, 4, and 5 can be formed so as to straddle an adjacent pair of I/O cells 6A and 6B, each electrode pad can have a large rectangular area. That is, a probe contact position at the time of inspection and a position for connection to a wire or a bump can be set separately from each other, so that a wire connection failure or a bump formation failure due to a probe trace can be prevented.

Needless to say, the number of cells necessary for the semiconductor device can be reduced since a power supply or GND electrode pad 4 or 5 can be placed (annexed) on the element formation region of each I/O cell 6 in addition to input/output signal electrode pads 3, thus making it possible to reduce the size of the semiconductor integrated circuit.

In other words, in the arrangement shown in FIG. 4, a pair of first I/O cells 6*a* (6A and 6B) each having two input/output signal electrode pads 3A and 3B and one power supply electrode pad 4 provided on its element formation region in this order from the inner side, i.e. the periphery, toward the outer side and a pair of second I/O cells 6*b* (6A and 6B) each having two input/output signal electrode pads 3A and 3B and one GND electrode pad 5 provided on its element formation region in this order from the inner side toward the outer side are mixedly located; each pair of input/output signal electrode pads and the pair of power supply electrode pads in the adjacent pair of the first I/O cells 6*a* (6A and 6B) are formed as one input/output signal electrode pad and one power supply electrode pad straddling the pair of I/O cells 6A and 6B; and each pair of input/output signal electrode pads and the pair of GND electrode pads in the adjacent pair of the second I/O cells 6*b* (6A and 6B) are formed as one input/output signal electrode pad and one GND electrode pad straddling the pair of I/O cells (corresponding to the fourth aspect of the present invention).

Figure 5:
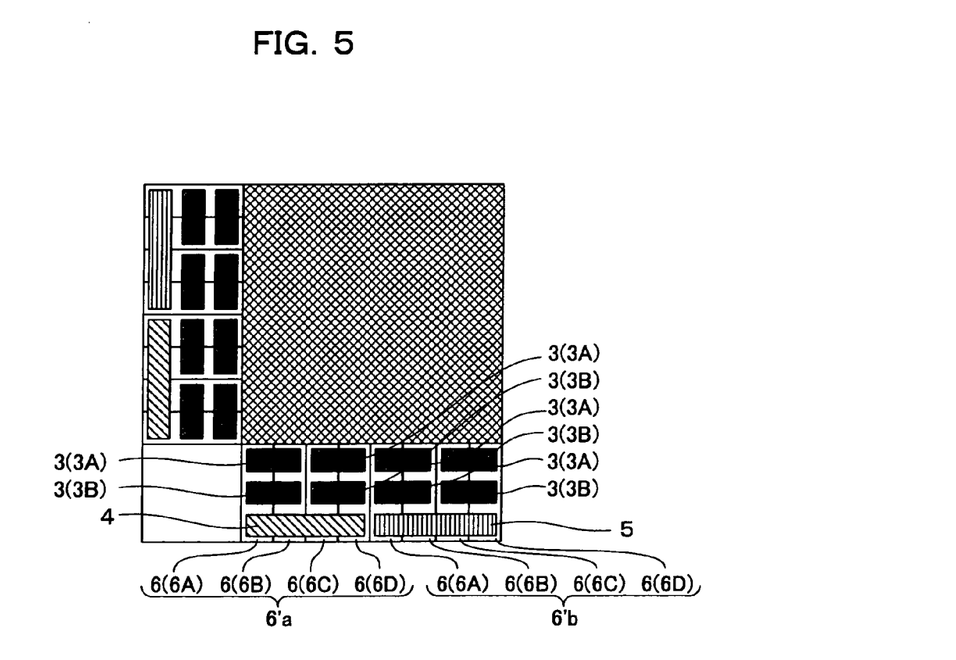
FIG. 5 is an enlarged plan view of an I/O cell portion according to still another example of modification of the semiconductor integrated circuit.

An arrangement such as shown in FIG. 5 may also be adopted in which a power supply or GND electrode pad 4 or 5 is formed so as to extend through three or more, for example, four I/O cells 6 (6A to 6D) to increase the wire connection regions relative to the number of I/O cells, for example, in comparison with the case shown in FIG. 4, where electrode pad 4 or 5 is formed so as to extend through an adjacent pair of I/O cells 6A and 6B, thus achieving stable connections to power supply and GND.

In other words, in the arrangement shown in FIG. 5, a first cell group 6′*a* formed of four I/O cells 6A to 6D adjacent one to another and each having two input/output signal electrode pads 3A and 3B and one power supply electrode pad 4 provided on its element formation region in this order from the inner side, i.e., the periphery, toward the outer side and a second cell group 6′*b* formed of four I/O cells 6A to 6D adjacent one to another and each having two input/output signal electrode pads 3A and 3B and one GND electrode pad 5 provided on its element formation region in this order from the inner side toward the outer side are mixedly located; each pair of input/output signal electrode pads in each of two adjacent pairs of I/O cells 6A and 6B, and 6C and 6D in the first cell group 6′*a* are formed as one input/output signal electrode pad straddling the pair of I/O cells; the power supply electrode pads 4 in the first cell group 6′*a* are formed as one power supply electrode pad extending through the four I/O cells 6A to 6D in the first cell group 6′*a*; each pair of input/output signal electrode pads in each of two adjacent pairs of I/O cells 6A and 6B, and 6C and 6D in the second cell group 6′*b* are formed as one input/output signal electrode pads straddling the pair of I/O cells; and the GND electrode pads 5 in the second cell group 6′*b* are formed as one GND electrode pad extending through the four I/O cells 6A to 6D in the second cell group 6′*b* (corresponding to the fifth aspect of the present invention).

Figure 6:
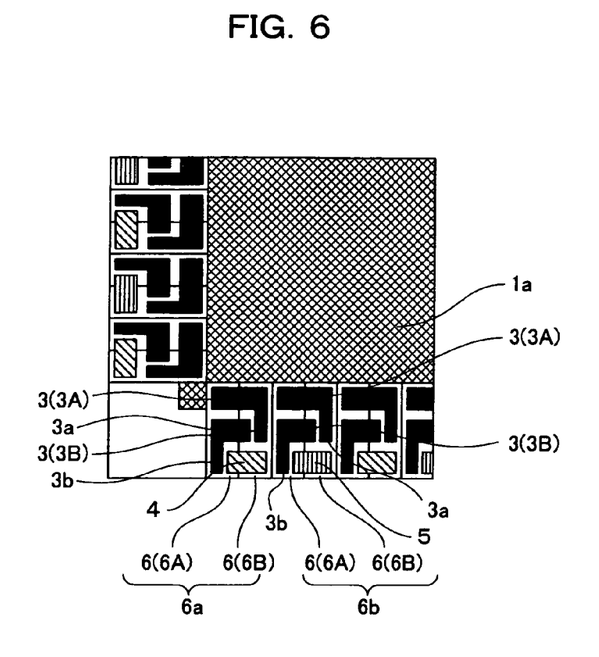
FIG. 6 is an enlarged plan view of an I/O cell portion according to a further example of modification of the semiconductor integrated circuit.

An arrangement such as shown in FIG. 6 may also be adopted in which two input/output signal electrode pads 3 (3A, 3B) are placed at an inner and intermediate positions so as to straddle an adjacent pair of I/O cells 6 (6A and 6B); one power supply electrode pad 4 or GND electrode pad 5 is placed at an outer position; the input/output signal electrode pad 3A at the inner position has at an end in the widthwise direction of the I/O cell 6 a small-width extension extending to a position corresponding to the position of the input/output signal electrode pad 3B at the intermediate position (properly speaking, to a position corresponding to an outer edge of this pad); and the input/output signal electrode pad 3B at the intermediate position has at the other end in the widthwise direction of the I/O cell 6 an extension extending to a position corresponding to the position of the power supply electrode pad 4 or the GND electrode pad 5 at the outer position (properly speaking, to a position corresponding to an outer edge of this pad). Needless to say, the power supply electrode pad 4 or the GND electrode pad 5 at the outer position has a slightly reduced width (in the widthwise direction of the I/O cell). In this case, the pair of I/O cells 6*a* (6A and 6B) on which the power supply electrode pad 4 is provided and the pair of I/O cells 6*b* (6A and 6B) on which the GND electrode pad 5 is provided are mixedly located, as are those described with reference to FIG. 4.

In this arrangement, a probing electrode region through which a lower-layer wiring region can be easily damaged is distanced from an active region of the semiconductor integrated circuit 1 by using each of the extensions (electrode pad portions) of the input/output signal electrode pads 3A and 3B as the probing electrode region, while the input/output signal electrode pad 3A at the inner position is formed above the active region of the semiconductor integrated circuit 1. In this way, the length of the I/O cell 6 can be further reduced to achieve a reduction in the size of the semiconductor integrated circuit.

Figure 7:
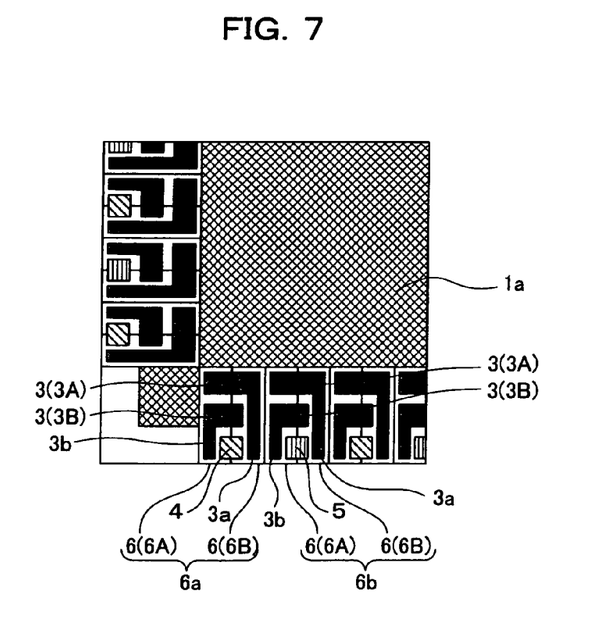
FIG. 7 is an enlarged plan view of an I/O cell portion according to a further example of modification of the semiconductor integrated circuit.

Further, an arrangement such as shown in FIG. 7 may be adopted in which two input/output signal electrode pads 3 (3A, 3B) are placed at an inner and intermediate positions so as to straddle an adjacent pair of I/O cells 6 (6A and 6B); one power supply electrode pad 4 or GND electrode pad 5 is placed at an outer position; the input/output signal electrode pad 3A at the inner position has at an end in the widthwise direction of the I/O cell 6*a* small-width extension extending to a position corresponding to the position of the power supply electrode pad 4 or the GND electrode pad 5 at the outer position (properly speaking, to a position corresponding to an outer edge of this pad); and the input/output signal electrode pad 3B at the intermediate position has at the other end in the widthwise direction of the I/O cell 6 an extension extending to a position corresponding to the position of the power supply electrode pad 4 or the GND electrode pad 5 at the outer position (properly speaking, to a position corresponding to an outer edge of this pad). Needless to say, the power supply electrode pad 4 or the GND electrode pad 5 at the outer position has a reduced width (in the widthwise direction of the I/O cell). Also in this case, the pair of I/O cells 6*a* (6A and 6B) on which the power supply electrode pad 4 is provided and the pair of I/O cells 6b (6A and 6B) on which the GND electrode pad 5 is provided are mixedly located, as are those described with reference to FIG. 6.

In this arrangement, the input/output signal electrode pads 3A and 3B are formed on an active region of the semiconductor integrated circuit 1, while the extensions 3a and 3b of the input/output signal electrode pads 3A and 3B are positioned outside the active region. In this way, the length of the I/O cell 6 can be further reduced to achieve a reduction in the size of the semiconductor integrated circuit.

A method of manufacturing the semiconductor integrated circuit, particularly the I/O cell portion will be described with reference to the drawings.

FIGS. 8A to 8D are sectional views for explaining the method of manufacturing the semiconductor integrated circuit in this embodiment.

Figure 8A:
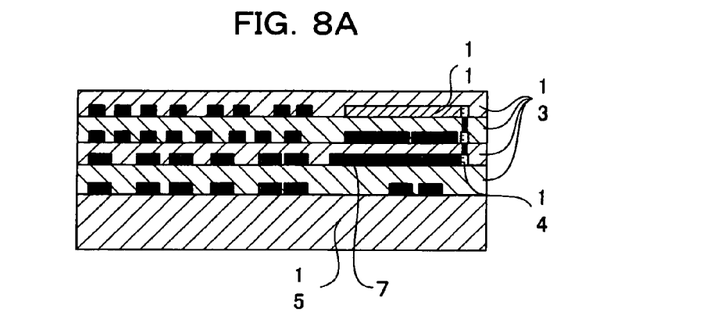
FIG. 8A is a sectional view showing an input/output circuit forming step for explanation of a method of manufacturing the semiconductor integrated circuit of the present invention.

First, as shown in FIG. 8A, elements including transistors and pieces of wiring are formed on a silicon substrate 15, for example, by using chemical vapor deposition (CVD), etching, ion implantation and an exposure technique, thereby forming an input/output signal circuit (an I/O cell element portion).

At this time, pad metal 11 having en electrical connection through lead metal 14 is formed as the uppermost layer to enable external electrical connection from the formed input/output signal circuit.

Figure 8B:
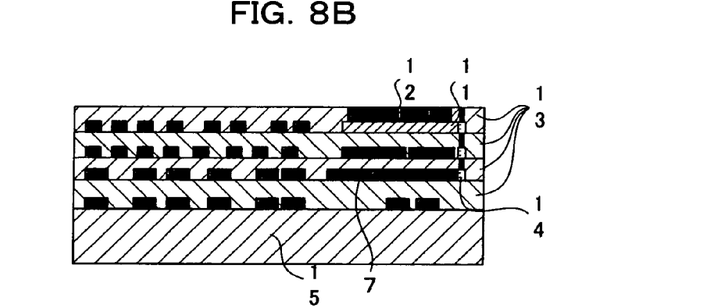
FIG. 8B is a sectional view showing a stacked via forming step in the manufacturing method.

Subsequently, as shown in FIG. 8B, vias 12 are formed on the pad metal 11 to obtain a stacked via structure in order to limit cratering caused in a bonding step such as a wire bonding step. This stacked via structure can be obtained by forming via holes and embedding the vias by using techniques for etching, sputtering and plating for example.

Figure 8C:
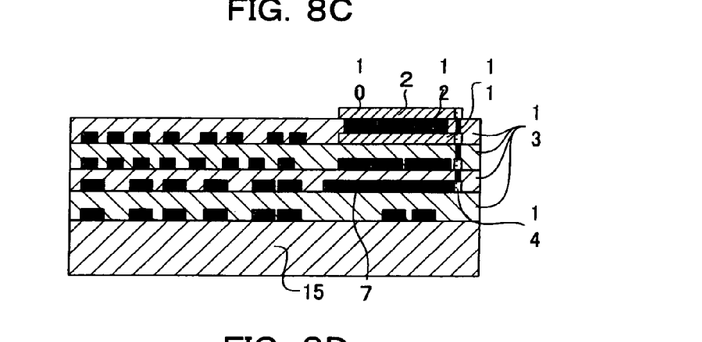
FIG. 8C is a sectional view showing an electrode pad forming step in the manufacturing method.

After the formation of the stacked via structure, electrode pads 10 formed of a metal such as aluminum are formed on the stacked vias 12 by using CVD, sputtering or the like, as shown in FIG. 8C.

At this time, power supply electrode pads 4 and/or GND electrode pads 5 are simultaneously formed on the element formation regions of the I/O cells 6 on which electrode pads 3 for input and output signals are also formed, as shown in FIG. 2 or 3; input/output signal electrode pads 3 and power supply or GND electrode pads 4 or 5 are formed so as to straddle adjacent pairs of I/O cells 6A and 6B, as shown in FIG. 4; power supply or GND electrode pads 4 or 5 are formed through three or more, for example, four I/O cells 6A to 6D, as shown in FIG. 5; or extensions 3a and 3b (electrode pad portions) of a predetermined width are extended outward from input/output signal electrode pads 3 to form probing electrode regions, as shown in FIG. 6 or 7.

Figure 8D:
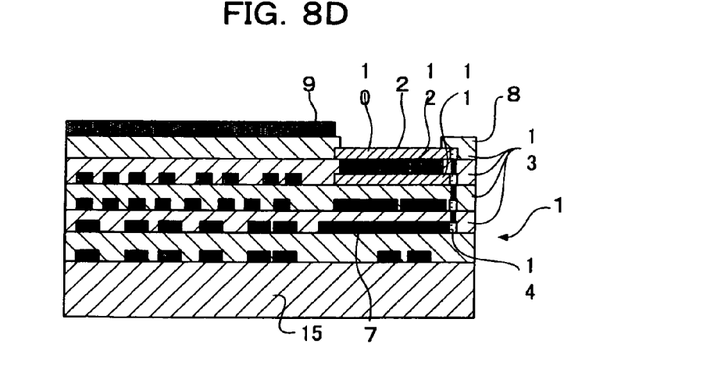
FIG. 8D is a sectional view showing a protective film forming step in the manufacturing method.

After the predetermined electrode pads have been formed as described above, first protective film 8 on the semiconductor circuit and second protective film 9 on first protective film 8 are formed by using CVD, etching or the like, as shown in FIG. 8D, thus obtaining the semiconductor integrated circuit 1. In FIGS. 8A to 8D, reference numeral 7 denotes a lowermost layer metal and reference numeral 13 denotes an interlayer insulating film.

The semiconductor integrated circuit of the present invention is capable of being reduced in size and supplying power and GND with stability even in a situation where the dependence of the chip size on the electrode pad area is increased with the adaptation of the diffusion process to a finer design rule and the design to operate the semiconductor integrated circuit at a lower voltage, and is useful as a semiconductor integrated circuit having I/O cells for performing input of power and GND and input/output of signals.

What is claimed is:

1. A semiconductor integrated circuit comprising:
an integrated circuit region, and
a plurality of I/O cells each having an element formation region for external electrical connection from the element formation region, the I/O cells located around the integrated circuit region, wherein
three electrode pads are located on the element formation region of each I/O cell, the first and second electrode pads of the three electrode pads from an inner position that is on an integrated circuit region side are input/output signal electrode pads, and the third electrode pad at an outer position is a power supply electrode pad or a GND electrode pad, wherein the three electrode pads are physically combined with corresponding electrode pads of an adjacent I/O cell, thereby forming electrode pads that straddle the pair of I/O cells.

2. The semiconductor integrated circuit according to claim 1, wherein
the power supply electrode pads or the GND electrode pads in four adjacent I/O cells are combined, thereby forming one power supply electrode pad and one GND electrode pad, respectively, that straddles the four I/O cells.

3. The semiconductor integrated circuit according to claim 1, wherein
the input/output signal electrode pad of one of the adjacent I/O cells has an L shape as viewed in plan and has a portion extending to the outer position.

4. The semiconductor integrated circuit according to claim 1, wherein
the input/output signal electrode pad of one of the adjacent I/O cells has an L shape as viewed in plan, with a portion extending to an outer edge of the power supply electrode pad located at the outer position.

5. A semiconductor integrated circuit comprising:
an integrated circuit region, and
a plurality of I/O cells extending from within the integrated circuit region outward from the integrated circuit region to surround an outer periphery of the integrated circuit region, each I/O cell having a connection region outward from the outer periphery of the integrated circuit region, said connection region for electrically connecting an integrated circuit in the integrated circuit region with an external element,
wherein each I/O cell comprises at least an inner electrode position closest to a center of the integrated circuit region, an outer electrode region at an end of the I/O cell farthest from the outer periphery of the integrated circuit region, and an intermediate electrode region between the inner electrode region and the outer electrode region,
an adjacent pair of first I/O cells comprise:
a first input/output signal electrode pad in the inner electrode region,
a second input/output signal electrode pad in the intermediate electrode region, and
one power supply electrode pad in the outer electrode region, each of said first and second input/output signal electrode pads and said power supply electrode pad straddling the adjacent pair of first I/O cells, and
an adjacent pair of second I/O cells comprise:
a third input/output signal electrode pad in the inner electrode region;
a fourth input/output signal electrode pad in the intermediate electrode region, and
one GND electrode pad in the outer electrode region, each of said third and fourth input/output signal electrode pads and said GND electrode pad straddling the adjacent pair of second I/O cells;

the first input/output signal electrode pad has a portion extending onto the intermediate position of one of the adjacent pair of first I/O cells;

the third input/output signal electrode pad has a portion extending onto the intermediate position of one of the adjacent pair of second I/O cells;

the second input/output signal electrode pad has a portion extending onto the outer position of one of the adjacent pair of first I/O cells; and the fourth input/output signal electrode pad has a portion extending onto the outer position of one of the adjacent pair of second I/O cells.

6. The semiconductor integrated circuit according to claim 5, wherein the first and third input/output signal electrode pads each have a portion extending along a lateral side of the second and fourth input/output signal electrodes, respectively, onto the outer electrode position of the pairs of first and second I/O cells, respectively, and the second and fourth input/output signal electrode pads each have a portion extending to the outer electrode position of the pairs of first and second I/O cells, respectively.

* * * * *